(12) United States Patent
Miyatke et al.

(10) Patent No.: US 6,842,361 B2
(45) Date of Patent: Jan. 11, 2005

(54) MEMORY CELL, MEMORY CIRCUIT BLOCK, DATA WRITING METHOD AND DATA READING METHOD

(75) Inventors: Hisatada Miyatke, Ohtsu (JP); Toshio Sunaga, Ohtsu (JP); Kohji Kitamura, Kusatsu (JP)

(73) Assignee: International Business Machines Corporation, Armonk, NY (US)

( * ) Notice: Subject to any disclaimer, the term of this patent is extended or adjusted under 35 U.S.C. 154(b) by 101 days.

(21) Appl. No.: 10/156,898

(22) Filed: May 28, 2002

(65) Prior Publication Data

US 2003/0081454 A1 May 1, 2003

(30) Foreign Application Priority Data

May 30, 2001 (JP) .......................................... 2001-161718

(51) Int. Cl.[7] .............................................. G11C 11/22
(52) U.S. Cl. .......................... 365/145; 365/158; 365/65; 365/117; 438/3
(58) Field of Search ................................. 257/108, 421, 257/422; 438/48; 365/158, 145, 65, 117, 209, 213

(56) References Cited

U.S. PATENT DOCUMENTS

| | | | | |
|---|---|---|---|---|
| 5,793,697 A | * | 8/1998 | Scheuerlein | 365/230.07 |
| 5,991,193 A | * | 11/1999 | Gallagher et al. | 365/171 |
| 6,005,800 A | * | 12/1999 | Koch et al. | 365/173 |
| 6,034,887 A | * | 3/2000 | Gupta et al. | 365/171 |
| 6,130,835 A | * | 10/2000 | Scheuerlein | 365/171 |
| 6,269,018 B1 | * | 7/2001 | Monsma et al. | 365/145 |
| 6,324,093 B1 | * | 11/2001 | Perner et al. | 365/171 |
| 6,349,054 B1 | * | 2/2002 | Hidaka | 365/173 |
| 2001/0038548 A1 | * | 11/2001 | Perner et al. | 365/66 |
| 2001/0038554 A1 | * | 11/2001 | Takata et al. | 365/185.09 |
| 2002/0036918 A1 | * | 3/2002 | Hidaka | 365/171 |
| 2002/0044481 A1 | * | 4/2002 | Hidaka | 365/158 |
| 2003/0123282 A1 | * | 7/2003 | Nickel et al. | 365/158 |
| 2004/0047196 A1 | * | 3/2004 | Hidaka | 365/200 |

OTHER PUBLICATIONS

Kouichi Yamada et al., "A Novel Sensing Scheme for a MRAM with a 5% MR Ratio," 2001 Symposium on VLSI Circuits Digest of Technical Papers, (Kyoto, Japan, Jun. 14–16, 2001).

* cited by examiner

*Primary Examiner*—David Nelms
*Assistant Examiner*—Long Tran
(74) *Attorney, Agent, or Firm*—Margaret A. Pepper

(57) ABSTRACT

An object of the present invention is to provide a memory cell, a memory circuit block, a data writing method, and a data reading method which realize a reduction in the number of metal layers, cost, and the chip size and an increase of production yields and product reliability. A memory cell 12 including a metal line 16 crossing a bit line 14 without contact therewith and a second conductive structure 24 connecting the metal line 16 and a switching element 20 is disclosed. A write driver circuit 26 for driving a write current through the metal line 16 and a ground 28 are connected to the metal line 16 through a switch 30 for selecting the circuit 26 or the ground 28.

7 Claims, 4 Drawing Sheets

MEMORY CELL, MEMORY CIRCUIT BLOCK, DATA WRITING METHOD AND DATA READING METHOD

BACKGROUND OF THE INVENTION

1. Field of the Invention

The present invention relates to a memory cell which is configured so as to select a write word line current driver circuit for data write operations or a ground for data read operations, a memory circuit block containing the memory cell, a data writing method, and a data reading method.

2. Description of Related Art

A memory cell 44 shown in FIG. 3 is a typical memory cell having one transistor and one magnetic tunnel junction (MTJ) which has been used in a 1-Kbit magnetic random access memory (MRAM) chip and 512-bit MRAM chip and is expected to be used in the future. In this memory cell 44, a nonvolatile MTJ element 38 is used as a memory element. In a memory cell array 43 of a typical memory circuit block 42 used in an MRAM or the like, word lines 50 and bit lines 46 are arranged in a matrix and the memory cells 44 are placed at the intersections of the word lines 50 and bit lines 46, as shown in FIG. 4.

The MTJ element 38 is a nonvolatile memory element composed of at least three layers of thin films: a pinned ferromagnetic layer 36 whose magnetization direction is fixed, a tunnel barrier 34 which drives a tunneling current, and a free ferromagnetic layer 32 which can change the direction of magnetization. The positions of the free layer 32 and the pinned layer 36 can be reversed, and therefore the pinned layer 36 can be connected to the bit line 46. When the direction of magnetization of the free layer 32 is the same as that of the pinned layer 36, the data stored in the MTJ element 38 is "0". When the direction of magnetization of the free layer 32 is different from that of the pinned layer 36, the data stored in the MTJ element 38 is "1". The bit line 46 is used for reading and writing data stored in the MTJ element 38.

In FIG. 3, a first conductive structure 48 electrically connects the MTJ element 38 to a diffusion area n of a drain (D) of a metal oxide semiconductor field effect transistor (MOSFET) 20 formed on a semiconductor substrate. The first conductive structure 48 is composed of MX, V2, M2, V1, M1, and CA wherein MX, M1, and M2 each are a metal line layer and V1, V2, and CA each are a conductor embedded in a via hole in an insulating layer.

A gate of the MOSFET 20 is part of a read word line 18. In a read operation, the MOSFET 20 is turned on by applying a read voltage to the word line 18, and thereby a current path from the bit line 46 to a ground 28 is formed. The resistance across the MTJ element 38 depends on the direction of magnetization of the free ferromagnetic layer 32 relative to that of the pinned ferromagnetic layer 36. Thus, the data stored in the MTJ element 38 can be read out as a current flowing through the MTJ element 38 or as a voltage value obtained from the current and the resistance of the MTJ element 38.

In a write operation, write currents flow both along the write word line 50 and along the bit line 46, thereby generating a combined magnetic field. The combined magnetic field can switch the direction of the magnetization of the free ferromagnetic layer 32. The direction of the magnetization of the free layer 32 is determined by the direction of the write current along the bit line 46.

In the known memory cell 44 shown in FIG. 3, an M1 layer 52 is used as a metal layer for the connection to the ground in a read operation, and an M2 layer is used for the write word line 50. Therefore, a current drives from the MTJ element 38 to the diffusion area n of the MOSFET 20 must go through the MX, V2, M2, V1, M1, and CA. Since many layers are required in the memory cell 44, yields are reduced in the production process and the reliability of a resulting product is decreased. In addition, the formation of many layers causes an increase in production cost. In such applications as a system-on-chip which incorporate an MRAM and other circuits on a single chip, global wiring is required for connection among circuit blocks on the chip. In those cases, if wiring layers are used up in the MRAM, additional upper wiring layers are required for global wiring and power supply wiring.

An object of the present invention is to provide a memory cell, a memory circuit block, a data writing method, and a data reading method which realize a high-yield, high-performance, low-power, high-reliability, and low-cost semiconductor magnetic memory and large scale integration (LSI) having the reduced number of metal line layers.

SUMMARY OF THE INVENTION

A memory cell of the present invention comprises: a bit line; a memory element which is connected to the bit line and which includes a ferromagnetic layer whose magnetization direction is determined by the direction of a magnetic field generated at least by a current along the bit line; a switching element; a first conductive structure which is so placed that the first conductive structure and the bit line sandwich the memory element and which connects the memory element to one end of the switching element; a metal line crossing the bit line without contact therewith; and a second conductive structure connecting the metal line to the other end of the switching element.

A memory circuit block of the present invention comprises: the above-described memory cell; a write driver circuit for driving a write current through the metal line; a ground; and a switch connected to the metal line for selecting the write driver circuit or the ground.

Another memory circuit block of the present invention comprises: a plurality of the above-described memory cells arranged in a matrix or in a line; switches which are each connected to one end of the connected metal lines or each metal line; write driver circuits for driving write currents through the metal lines connected to the switches; and grounds connected to the switches, wherein the bit lines of the adjacent memory cells are connected to each other and/or the metal lines of the adjacent memory cells are connected to each other.

According to the present invention, a data writing method in a memory circuit block having the above-described memory cell, a write driver circuit for driving a write current through the metal line, a ground, and a switch connected to the metal line for selecting the write driver circuit or the ground, comprises the steps of: connecting the metal line and the write driver circuit through the switch; driving a write current through the metal line; and driving a write current through the bit line.

A data writing method in a memory circuit block in which metal lines or bit lines of adjacent memory cells are connected to each other, switches are provided to one end of each of the connected metal lines, and write driver circuits and grounds are connected to the switches, comprises the steps of: connecting the write driver circuit and the connected metal line through the switch; driving a write current through the metal line; and the driving a write current through the bit line.

According to the present invention, a data reading method in a memory circuit block having the above-described memory cell, a write driver circuit for driving a write current through the metal line, a ground, and a switch connected to the metal line for selecting the write driver circuit or the ground, comprises the steps of: connecting the metal line and the ground though the switch; turning on the switching element in the memory cell; and driving a read current through the bit line.

A data reading method in a memory circuit block in which metal lines or bit lines of adjacent memory cells are connected to each other, switches are provided to one end of each of the connected metal lines, and write driver circuits and grounds are connected to the switches, comprises the steps of: connecting the connected metal line and the ground through the switch; turning on the switching element in the memory cell; and driving a read current through the bit line.

DESCRIPTION OF THE PREFERRED EMBODIMENTS

Next, embodiments of the memory cell, the memory circuit block, a data writing method, and the data reading method according to the present invention will be described with reference to the accompanying drawings.

Figure 1:
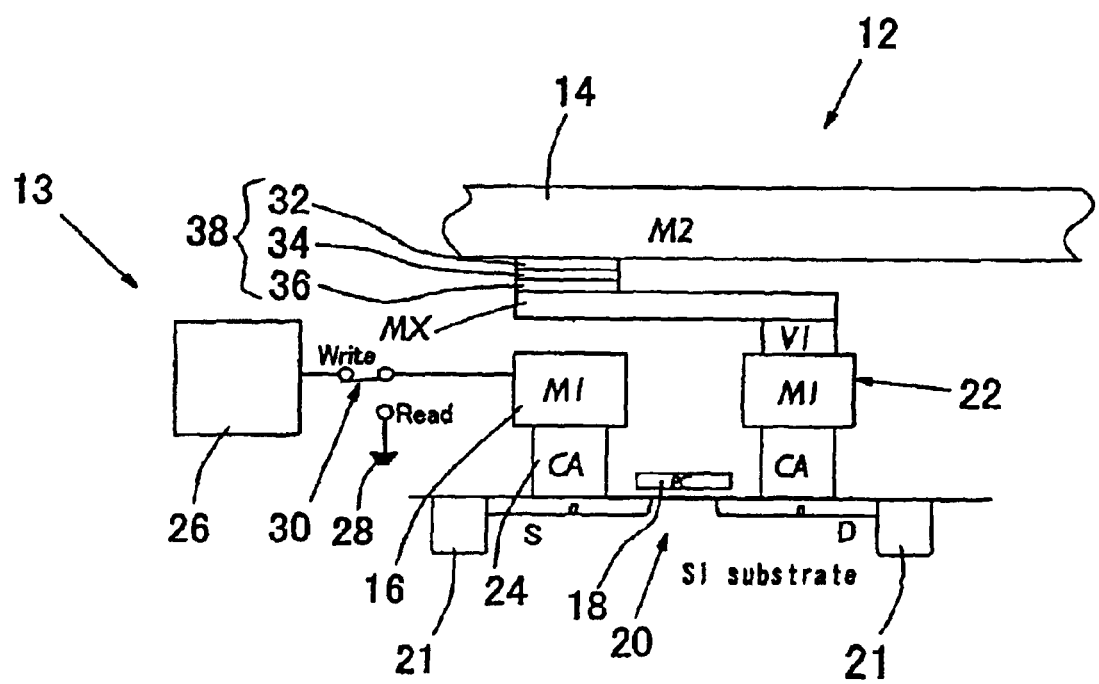
FIG. 1 shows an example of a memory cell structure according to the present invention.

As shown in FIG. 1, a memory cell 12 comprises a bit line 14; a memory element 38 connected to the bit line 14 and comprising a ferromagnetic layer whose magnetization direction is determined by the direction of a magnetic field; a switching element 20, and a first conductive structure 22 connecting the memory element 38 and the switching element 20.

The memory cell 12 comprises a metal line 16 crossing the bit line 14 without contact therewith. The metal line 16 is so placed that the memory element 38 is sandwiched between the metal line 16 and the bit line 14. The metal line 16 is electrically connected to the switching element 20 by a second conductive structure 24 which is shown as "CA" in FIG. 1.

The memory element 38 connected to the bit line 14 and the first conductive structure 22 can be an MTJ element. The MTJ element 38 is composed of a pinned magnetic layer 36 whose magnetization direction is fixed, a tunnel barrier 34 which allows a tunneling current to flow through it, and a free ferromagnetic layer 32 whose magnetization direction is determined by the direction of a magnetic field. While the bit line 14 is connected to the free layer 32 in FIG. 1, it may be connected to the pinned layer 36.

Normally, an MOSFET is used as the switching element 20. The first conductive structure 22 is connected to a diffusion area n of a drain (D) of the MOSFET. The second conductive structure 24 is connected to a diffusion area n of a source (S) of the MOSFET. A read word line 18 is used as a gate of the MOSFET. The MOSFET is turned on by applying a read voltage to the read word line. In this case, a current path from the bit line 14 to the ground 28 is formed by connecting the ground 28 to the metal line 16 and the second conductive structure 24 through the switch 30.

Figure 3:
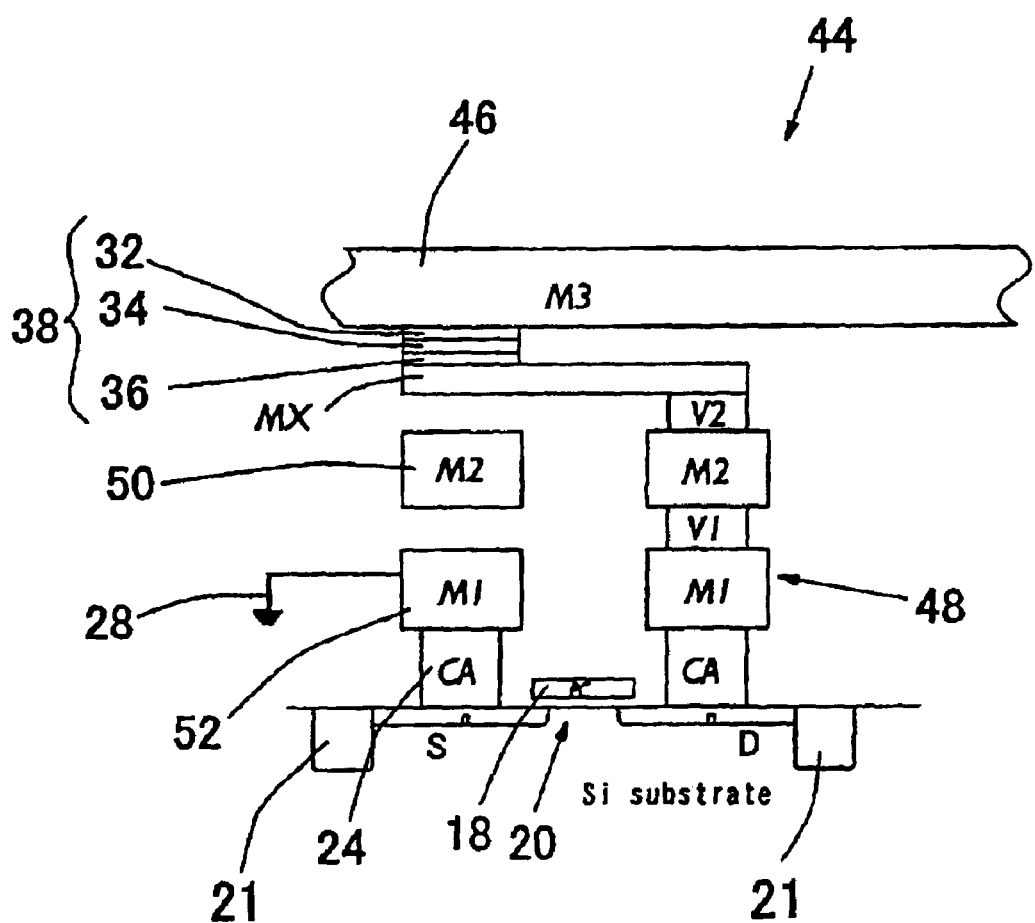
FIG. 3 is a side view of a known memory cell.
Figure 4:
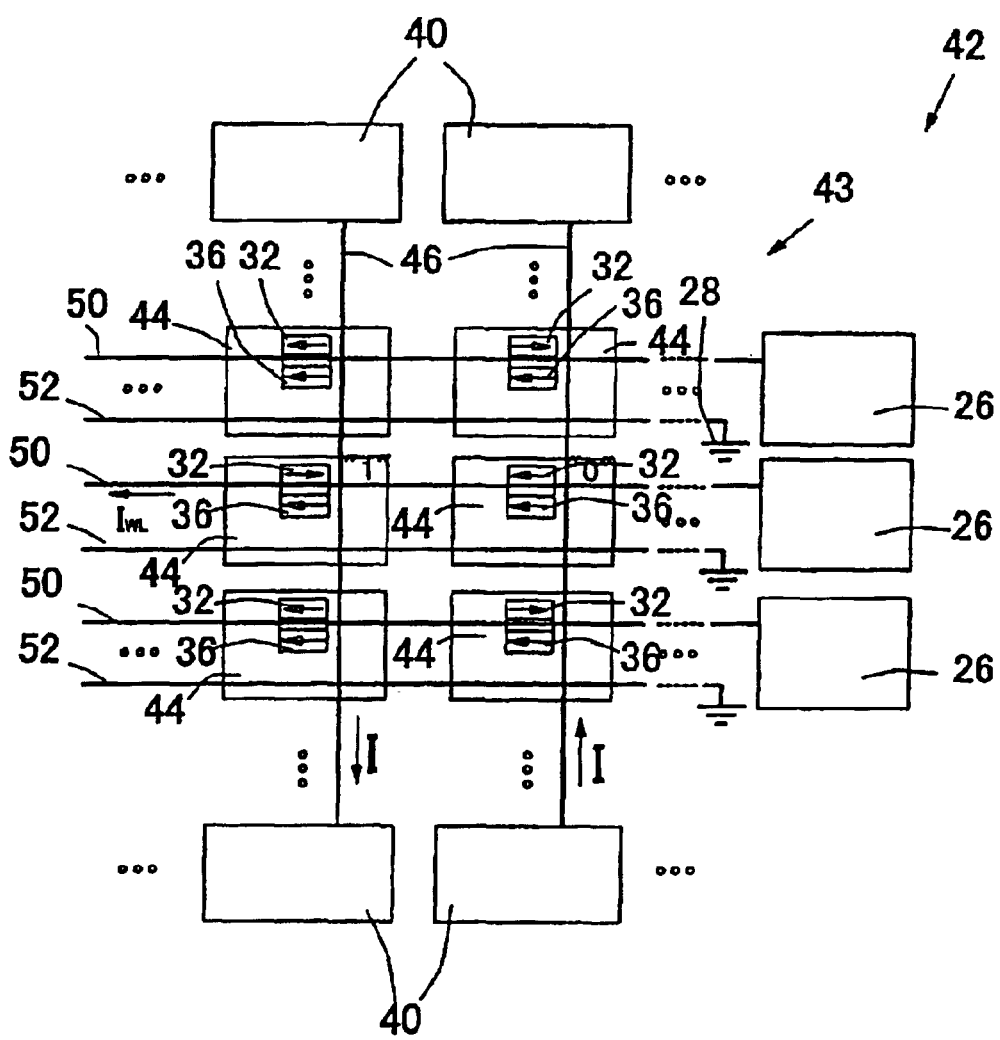
FIG. 4 shows an example of a circuit configuration of a memory circuit block containing the memory cells shown in FIG. 3.

The first conductive structure 22 is composed of MX, V1, M1, and CA, wherein MX and M1 each are a metal line layer and V1 and CA each are a conductor embedded in a via hole in an insulating layer. Compared to the conventional memory cell 44 shown in FIG. 3, the memory cell 12 of the present invention comprises the reduced number of layers, that is, the memory cell 12 of the present invention does not comprise V2 and M2 layers. Although, in FIG. 1, the bit line 14 is electrically connected to the free ferromagnetic layer 32 of the MTJ element 38, the bit line 14 may be connected to the pinned magnetic layer 36.

In the case of a memory circuit block 13 with the above-described memory cell 12, the block 13 comprises a write circuit 26 for driving a write current through the metal line 16 and a ground 28, as shown in FIG. 1. The metal line 16 is connected to the write circuit 26 or the ground 28 through the switch 30 connected to the line 16. The switch 30 can be a MOSFET. This block 13 can be used for storing 1-bit data.

A data writing method in a memory circuit block 13 with the memory cell 12 is described below. First, the write driver circuit 26 is connected to the metal line 16 through the switch 30. Then the write driver circuit is activated to drive write current through the metal line 16, generating the magnetic field around the write word line. At the same time, current is driven through the bit line 14 to generate the magnetic field around the bit line. The direction of the combined magnetic field of the thus-obtained two magnetic fields determines the direction of magnetization of the free ferromagnetic layer 32 of the MTJ element 38. The procedure above makes it possible to write data into the MTJ element 38. For example, in FIG. 1, given that data "1" is written into the MTJ element 38 when a write current flows through the bit line 14 from right to left, data "0" is written into the MTJ element 38 when a write current flows through the bit line 14 from left to write.

Further, a data reading method is described. The ground 28 and the metal line 16 are connected through the switch 30. The switching element 20 is turned on by applying a read voltage to the read word line 18, and thus the current path from the bit line 14 to the ground 28 is formed. While the switching element 20 is on, a read current is driven through the bit line 14 to detect a resistance of the MTJ element 38. For example, given that data "1" is stored in the MTJ element 38 when a voltage between terminals of the MTJ element 38 is high, data "0" is stored in the MTJ element 38 when the voltage is low. Alternatively, given that the data "1" is stored in the MTJ element 38 where the current flowing through the MTJ element is small when a constant voltage is applied, the data "0" is stored in the MTJ element 38 where the current flowing through the MTJ element is large.

Thus, the metal line 16 of the memory cell 12 functions as a write word line and as a metal line for forming a current path from the switching element 20 to the ground 28. The memory cell 12 of the present invention has at least one fewer metal line layers than the known memory cell 44. Therefore, in the present invention, a cell structure is more simplified and yields are improved in a production process. In addition, a shorter length of the first conductive structure 22 reduces parasitic resistance.

Figure 2:
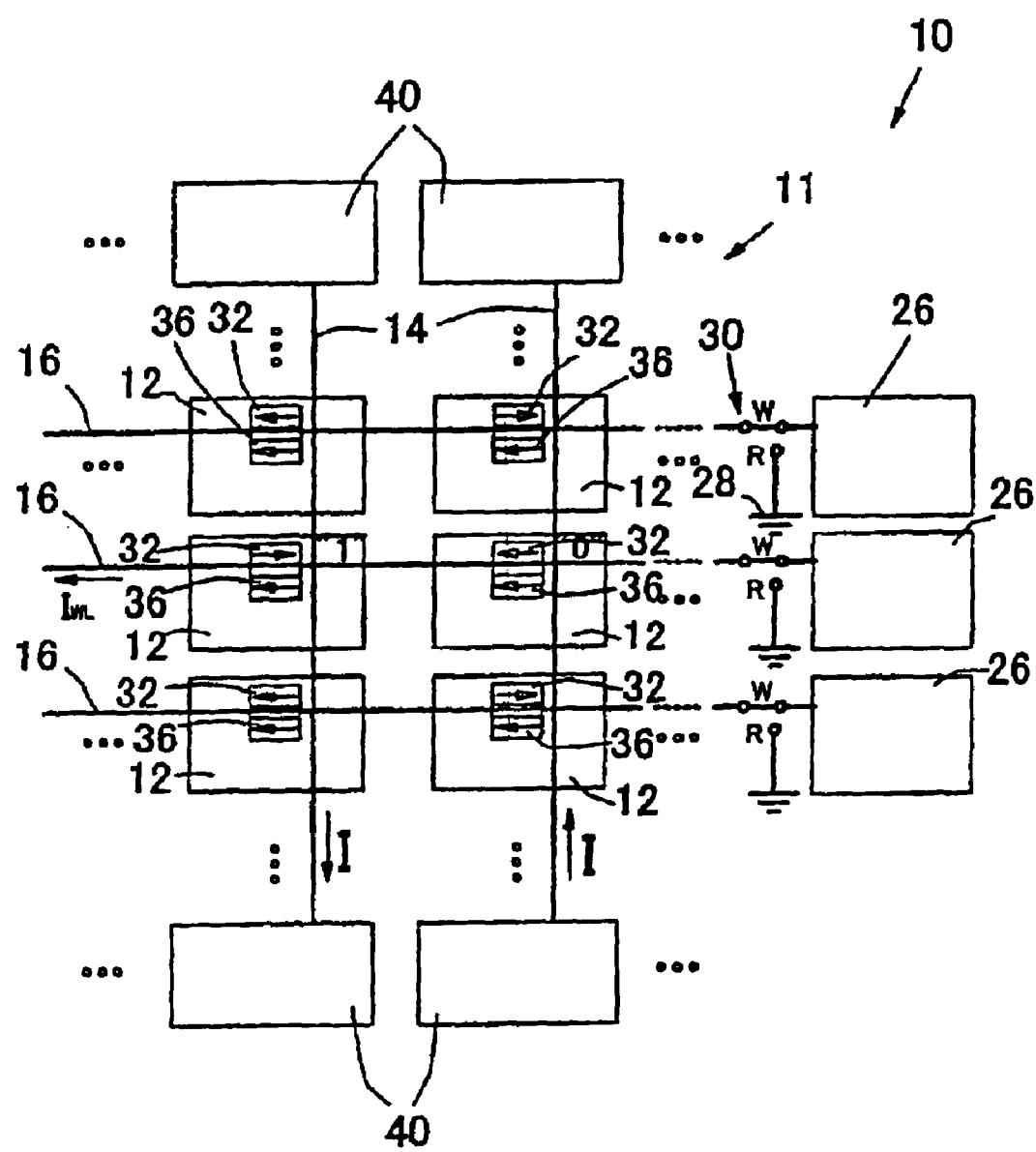
FIG. 2 shows an example of a circuit configuration of a memory circuit block according to the present invention.

Next, a memory circuit block 10 with a plurality of memory cells 12 is described. As shown in FIG. 2, bit lines 14 and metal lines 16 are arranged in a matrix, and the memory cells 12 are placed at their intersections, thus forming a memory cell array 11. In other words, the memory cells 12 arranged in a column (or arranged vertically in FIG. 2) are connected to the bit line 14, and the memory cells arranged in a row (or arranged horizontally in FIG. 2) are connected to the metal line 16. In FIG. 2, arrows indicate the directions of magnetization of the free ferromagnetic layer 32 and the pinned magnetic layer 36.

In the memory circuit block 10, one or required number of the switches 30, write circuits 26, and ground nodes 28 are provided respectively to an end of each of metal lines 16. The switch 30 can switch between the write driver circuit 26 and the ground node 28. An MOSFET can be used as the switch 30. Only one set of the switch 30, the write circuit 26, and the ground 28 is sufficient enough if the switch 30, the write circuit 26, and the ground 28 are connected to the metal line 16 selected by the row address.

Since data written into the memory cell 12 varies according to the direction of the write current driven through the bit line 14, write circuits 40 are provided on both ends of the bit line 14.

The memory circuit block 10 can be used in the memory circuit block in an MRAM or a logic chip.

A data writing method in the memory circuit block 10 is described. The metal line 16 is connected to the write driver circuit 26 through the switch 30 in a write operation. The write driver circuit 26 drives a write current IWL through the metal line 16. At the same time, a write current I is driven through the bit line 14. Thereby data is written into the MTJ element 38 in the memory cell 12 at the intersection of the metal line 16 and the bit line 14. For example, in FIG. 2, when the write current IWL is driven through the metal line 16 in the middle row and the write currents Is are driven through the bit lines 14, data are written into the memory cells in the middle row. In FIG. 2, data "1" is written into the MTJ element 38 when the write current I flows from top to bottom of the bit line 14, whereas data "0" is written into the MTJ element 38 when the written current I flows from bottom to top of the bit line 14. Thus, the data written into the MTJ element 38 varies depending on the direction of the flow of the write current I. As in the case of the known MRAM memory circuit block, the metal line 16 functions as a write word line.

A data reading method is described. In the read operation, the metal line 16 is connected to the ground 28 through the switch 30. The switching element 20 is turned on by applying voltage to the read word line 18, and thus a current path from the bit line 14 to the ground 28 is formed. Then a read current is driven through the bit line 14 to detect a resistance of the MTJ element 38. If the voltage is low when a constant current is applied, data "0" is stored in the MTJ element 38. On the contrary, if the voltage is high, data "1" is stored in the MTJ element 38. Alternatively, if a current flowing through the MTJ element 38 is small when a constant voltage is applied, the data "1" is stored, whereas the data "0" is stored in the MTJ element 38 if the current flowing through the MTJ element 38 is large. In the read operation, the metal line 16 performs a function of connecting the ground 28 and the source of the MOSFET 20.

The memory circuit block 10 contains the memory cell 12 in which one metal line 16 performs two functions of the write word line and the metal line connected to the ground 28. Therefore, the number of metal line layers contained in the block 10 can be reduced, and thereby production process steps (wafer steps) and production cost are reduced. In addition, the reduced process steps results in the improvemtnt of the production yield of the memory circuit block 10 and the increase of the reliability of the memory circuit block 10 and a chip containing the block 10. The number of the metal line layers in the memory cell 12 is reduced, so that the upper metal line layers can be used for other purposes. This results in the reduction of the chip area, the enhancement of power source, and the shortening of a line length between the internal circuit and input/output pads on the chip. In these points too, the production yield is improved, the production cost and power consumption are reduced, and the reliability is increased.

The metal line 16, the second conductive structure 24, and the source of the MOSFET 20 are electrically connected in a write operation, the parasitic capacity of the write word line (i.e. metal line 16) of the memory cell 12 is larger than that of the write word line 50 of the conventional memory cell 44. However, since data is written using current and not voltage, such large parasitic capacity exerts little influence on the data writing.

As stated above, the cell structure of the present invention brings the following merits:

(1) The number of metal line layers in the memory cell can be reduced by at least one layer, and thereby the number of layers having via holes can be reduced by one;

(2) Accordingly, at least two masks are eliminated from the wafer process; one is the metal layer mask and the other is the accompanying via mask;

(3) As a result of (1) and (2), the wafer process is simplified, the process yield is improved, and thus the process cost decreases;

(4) Since at least two of the electrical contacts are eliminated due to the reduction of the number of metal line layers, a parasitic resistance decreases, and the reliability of the product is increased;

(5) As a result of (1), the unused metal layer(s) can be used for other purposes, such as wiring for other circuit blocks, C4 pads (pads for soldering ball) for chip I/Os, and so on in applications such as a system-on-chip; and (6) The size of the chip containing the memory cell 12 can be reduced. As the result, the cost and power consumption of the chip are reduced and the reliability of the chip is increased. Alternatively, the chip can contain more functions, so that the cost per function can be reduced and the reliability per function can be increased.

While the embodiments of the memory cell, memory circuit block, data writing method, and data reading method have thus been described, the present invention is not limited to the above embodiments. For example, the MTJ element may be replaced with a giant magnetoresistive (GMR) element.

The memory cell 12 can be used not only in the two-dimensional memory cell array 11 as shown in FIG. 2, but also in one-dimensional array memory circuit blocks in logic LSIs such as an 8-bit register.

Many changes, modifications, variations and other uses and applications can be made to the embodiments on the basis of knowledge of those skilled in the art without departing from the scope of the present invention.

The structure of the memory cell of the present invention is more simplified than that of the known memory cell, so that the production process steps can be reduced, production yields can be improved, and production cost can be reduced.

Further, the reduced number of wiring layers also improves the reliability. Since unused wiring layer(s) can be used for other purposes, the chip area including the memory cells can be reduced, and thereby the cost and power consumption of the chip can be reduced and the reliability of the chip can be improved. Alternatively, the chip can contain more functions.

What is claimed is:

1. A memory circuit block comprising:
   a memory cell comprising:
      a bit line;
      a memory element connected to the bit line and including a ferromagnetic layer whose magnetization direction is determined by a direction of a magnetic field generated by a current at least along the bit line;
      a first switching element;
      a first conductive structure being so placed that the first conductive structure and the bit line sandwiches the memory element and connecting the memory element to one end of the first switching element;
      a metal line crossing the bit line without contact therewith; and
      a second conductive structure connecting the metal line to the other end of the first switching element;
   a write driver circuit for driving a write current through the metal line;
   a ground; and
   a second switching element connected to the metal line for selecting the write driver circuit or the ground.

2. The memory cell according to claim 1, wherein said memory element is a magnetic tunnel junction (MTJ) element.

3. The memory cell according to claim 1, wherein said first switching element is a metal oxide semiconductor field effect transistor (MOSFET), one end of said first switching element is a drain, and the other end of said first switching element is a source.

4. A memory circuit block according to claim 1 comprising a plurality of the memory cells.

5. The memory circuit block according to claim 4, wherein the bit lines of the adjacent memory cells are connected to each other.

6. The memory circuit block according to claim 4, wherein the metal lines of the adjacent memory cells are connected to each other.

7. The memory circuit block according to claim 4, comprising:
   a plurality of the write driver circuits for driving a write current through each of the connected metal lines;
   a plurality of the grounds; and
   a plurality of the second switching elements connected to each one end of the connected metal lines for selecting the write driver circuit or the ground.

* * * * *